(12) United States Patent
Landis et al.

(10) Patent No.: US 8,486,514 B2
(45) Date of Patent: Jul. 16, 2013

(54) METHOD TO FABRICATE A MOULD FOR LITHOGRAPHY BY NANO-IMPRINTING

(75) Inventors: Stéfan Landis, Voiron (FR); Yves Morand, Grenoble (FR)

(73) Assignee: Commissariat a l'Energie Atomque, Paris (FR)

( * ) Notice: Subject to any disclaimer, the term of this patent is extended or adjusted under 35 U.S.C. 154(b) by 350 days.

(21) Appl. No.: 12/715,738

(22) Filed: Mar. 2, 2010

(65) Prior Publication Data
US 2010/0227125 A1 Sep. 9, 2010

(30) Foreign Application Priority Data
Mar. 3, 2009 (FR) ...................................... 09 51337

(51) Int. Cl.
*B32B 3/28* (2006.01)
*B32B 3/30* (2006.01)

(52) U.S. Cl.
USPC ............................ 428/167; 428/156; 428/188

(58) Field of Classification Search
USPC .......................................... 428/156, 167, 188
See application file for complete search history.

(56) References Cited

U.S. PATENT DOCUMENTS

| | | |
|---|---|---|
| 6,294,450 B1 | 9/2001 | Chen et al. |
| 6,399,502 B1 | 6/2002 | Hernandez et al. |
| 6,407,443 B2 | 6/2002 | Chen et al. |
| 6,544,863 B1 | 4/2003 | Chong et al. |
| 6,759,180 B2 | 7/2004 | Lee |
| 7,256,435 B1 | 8/2007 | Kornilovich et al. |
| 7,405,089 B2 * | 7/2008 | Bloess et al. .................... 438/14 |
| 2002/0075554 A1 | 6/2002 | Brophy et al. |
| 2006/0021967 A1 | 2/2006 | Lee |
| 2006/0063387 A1 | 3/2006 | Miller et al. |
| 2006/0186084 A1 | 8/2006 | Wang et al. |
| 2006/0198919 A1 | 9/2006 | Tong |
| 2008/0268351 A1 | 10/2008 | Landis et al. |

FOREIGN PATENT DOCUMENTS

| | | |
|---|---|---|
| EP | 1 041 639 A1 | 10/2000 |
| EP | 1 333 324 A2 | 8/2003 |
| FR | 2 893 018 | 5/2007 |
| WO | WO 2004/022478 A1 | 3/2004 |
| WO | WO 2007/030527 A2 | 3/2007 |
| WO | WO 2008/138361 A1 | 11/2008 |

OTHER PUBLICATIONS

F. Carcenac, et al., "Fabrication of high density nanostructures gratings (>500Gbit/in$^2$) used as molds for nanoimprint lithography", Microelectronic Engineering vol. 53, 2000, pp. 163-166.
Gun-Young Jung, et al., "Circuit Fabrication at 17 nm Half-Pitch by Nanoimprint Lithography", Nano Letters, vol. 6, No. 3. 2006, pp. 351-354.
G.Y. Jung, et al., "Fabrication of a 34 x34 Crossbar Structure at 50 nm Half-pitch by UV-based Nanoimprint Lithography", Nano Letters, vol. 4, No. 7, 2004, pp. 1225-1229.
Yong Chen, et al., "Nanoscale molecular-switch crossbar circuits", Nanotechnology, vol. 14, 2003, pp. 462-468.

* cited by examiner

*Primary Examiner* — Catherine A Simone
(74) *Attorney, Agent, or Firm* — Oblon, Spivak, McClelland, Maier & Neustadt, L.L.P.

(57) ABSTRACT

A nano-imprint device including at least: a substrate, having a surface, on the substrate, a plurality of nano-trenches parallel two by two, each nano-trench extending in a longitudinal direction and being delimited laterally by side walls, the nano-trenches and the side walls being directed substantially perpendicular to the surface of the substrate, each nano-trench comprising a bottom surface with at least one first and one second level in a direction perpendicular to the substrate, respectively of depth h1 and h2>h1, measured relative to the top of the side walls, and the bottom surfaces of the nano-trenches, of the least deep level (h1) being in a first type of material, the side walls being in a second type of material.

11 Claims, 13 Drawing Sheets

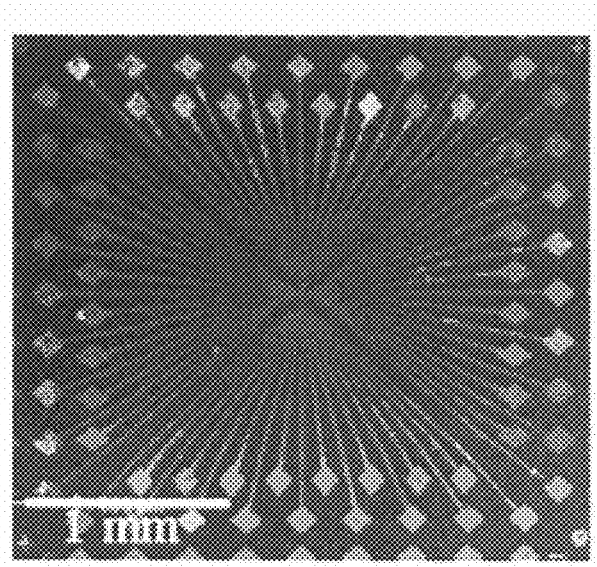
FIG.1A
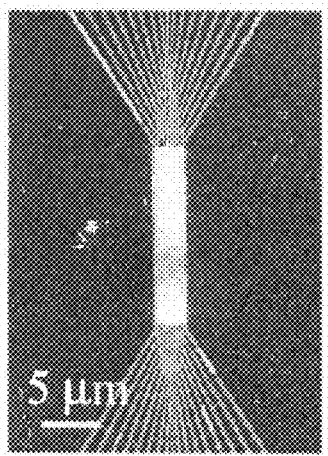 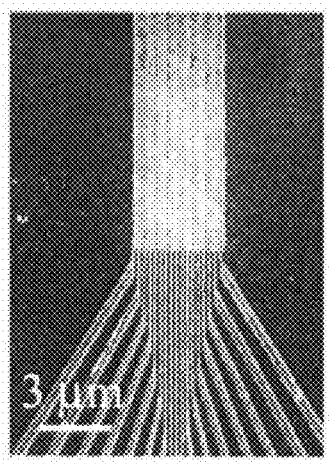 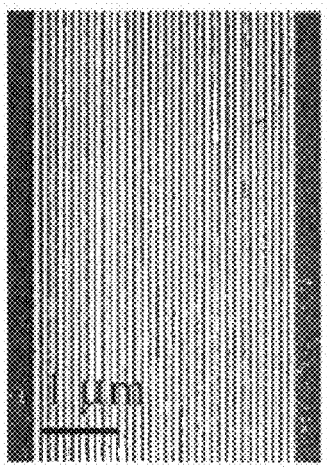
FIG.1B  FIG.1C  FIG.1D

METHOD TO FABRICATE A MOULD FOR LITHOGRAPHY BY NANO-IMPRINTING

TECHNICAL AREA AND STATE OF THE ART

The invention concerns the so-called area of nano-imprinting, a lithography technique used to produce an imprint of positive type by pressing a mould comprising negative-type patterns, possibly having micrometric and/or nanometric dimensions, into a layer of resin deposited on a substrate to be structured.

It is therefore possible to obtain patterns having a width of a few nanometers to several microns, in a resin or polymer, and then to transfer them to a substrate.

With this technique it is possible to form numerous structures rapidly, economically and reliably from a single mould; use of the mould only requires one single implementation of techniques which are costly as regards time and/or money and which alone can be used to obtain structures having the desired nanometric resolutions.

Two approaches are currently possible to conduct lithography by nano-imprinting:

thermal imprinting which consists of heating a polymer beyond its glass transition temperature, and of shaping it with a mould generally in silicon or nickel, UV-assisted imprinting. In this case a transparent mould e.g. in quartz is pressed into a monomer or pre-polymer cross-linked by UV exposure while the mould is applied. This technique is currently undergoing major development, since it is possible to align different imprinted levels with a transparent mould.

The fabrication of the moulds is a critical step since the resolution, lifetime of the mould, nano-imprinting and nano-moulding production rate and profitability largely depend on the quality and cost of the mould used.

The patterns to be printed, in relief on the surface of a mould are obtained:

either by electronic lithography and reactive ionic etching, or by duplication of another prefabricated mould (master).

Having regard to the performance levels of electronic lithography systems, to the electron-resin/substrate interaction and the properties of the resin used, the minimum size which can be obtained is typically 20 to 50 nm for dense patterns (arrays of lines or pads or spaces) and can reach 6 to 10 nm for so-called isolated patterns e.g. lines. To define structures of even smaller size, a beam of electrons of greater energy can be used as described by F. Carcenac et al. in Microelectron. Eng. 53, p. 163 (2000).

The electronic lithography method e.g. of the so-called "e-beam" type is generally used to fabricate moulds with very high resolution. Optical lithography methods (193 nm immersion lithography) do not permit patterns with a resolution of less than 30 nm to be obtained.

With known techniques it is difficult to obtain masks in three dimensions i.e. nano-imprint moulds with which it is possible to obtain several pattern depths and/or heights in the press material, and even more so when arrays are of small size, less than 10 or 20 nm.

While electronic lithography permits both the defining of 2D-type patterns, each pattern having the same depth using so-called threshold resins, and of 3D type (with variable depth depending on patterns) using so-called greyscale resins, it is nevertheless not possible at the present time to combine the ultimate resolution capacities of electronic lithography with its capability to form patterns of 3D type. It is additionally difficult to combine these two characteristics with a high pattern density.

Another technique can be used to form arrays of nano-imprint patterns that are dense and of small size. This technique is set forth in U.S. Pat. No. 6,759,180 B2, and comprises the successive sequence, in predefined trenches, of a conforming oxide deposit step, deposit step of Si filling, polishing, oxide etching. Each cycle allows a pattern in silicon to be formed in a pre-existing trench, thereby forming two new trenches separating the new pattern from the walls of the pre-existing trench.

This technique forms dense arrays of patterns separated by nano-trenches. However this type of method does not allow patterns in three dimensions to be obtained i.e. with more than two levels for the patterns.

Finally the electric connection between dense, thin conductor patterns called nano-patterns, obtained on a substrate using a nano-imprint technique, and the upper integration level is not easy.

Since the upper levels are obtained using conventional lithography techniques, their dimensions are greater. Attempting a connection by the formation of a via in the direction of the level of the nano-patterns, runs the risk of connecting several nano-patterns to each other.

As illustrated FIGS. 1A to 1D, to overcome this difficulty, the state of the art proposes using tree structures which create local distancing of the patterns. This makes it possible to create points where contacting can be achieved using known lithography techniques. These figures show a global view of the array with the contact tap points distanced from the array itself (FIG. 1A). Magnified views of the array are then shown illustrating tree structures at the two ends of the array (FIG. 1B), details of one of the ends and of the tree structure separating the lines of the array (FIG. 1C) and finally a close-up view showing the line density of the array (FIG. 1D).

One of the major defects of this type of solution is the occupied surface area. Another major defect is the distance added to the patterns to allow this structure. This added distance considerably increases the resistance of the nano-lines produced.

One purpose of the invention is to form dense structures capable of having patterns in three dimensions.

One advantageous embodiment of a device according to the invention also permits the electric addressing of dense arrays of nano-patterns, formed by nano-imprinting a mould according to the invention, which takes up less space than known techniques.

DISCLOSURE OF THE INVENTION

The invention firstly concerns a nano-imprint device in three dimensions characterized in that it comprises at least:

a) a substrate, having a surface (X,Y), b) and, on this substrate, a plurality of trenches or nano-trenches parallel two by two, each trench or nano-trench extending in a longitudinal direction and being delimited laterally by side walls, the trenches or nano-trenches and the walls being parallel to each other and to said longitudinal direction, and being directed substantially perpendicular to said surface of the substrate, each trench or nano-trench comprising at least a first and a second level in a direction perpendicular to the substrate, respectively of depth h1 and h2>h1, measured relative to the top of the side walls, c) the bottom of the trenches or nano-trenches, at the least deep level (h1), being in a first type of material, the side walls being in a second type of material, the first type of material able to be etched selectively relative to the second type of material forming the walls of the trench or nano-trench.

Selectivity concerns wet or dry chemical etching.

There may be more than 2 levels in the etched regions, which results from 3 etching steps for example.

A device according to the invention therefore comprises a plurality of trenches or nano-trenches separated by walls, thereby forming an array of patterns (tops of the walls) and of nano-trenches such that:

a) the patterns are at a high level, higher than the levels of the trenches or nano-trenches, and correspond to the walls of the trenches or nano-trenches; they consist of a material different to the bottom of the trenches or nano-trenches, b) the trenches or nano-trenches comprise portions with a first depth h1 and portions with a greater depth h2.

Each deep part of depth h2 can lie at one end of a trench or nano-trench and be delimited by four faces:

one face in a first type of material, of height h2-h1, in the direction perpendicular to the substrate, two faces formed by two side walls consisting of the second type of material, one face consisting of the first type of material, of depth h2, and whose top lies at the same level or substantially the same level as the walls surrounding the trench or nano-trench.

The plurality of trenches or nano-trenches separated by side walls can form an array of patterns and of trenches or nano-trenches, each portion of trench or nano-trench of depth h2 being offset relative to an adjacent portion of nano-trench by a period P*, along said longitudinal direction.

The deep parts of the nano-trenches are then aligned for example along an axis forming an angle θ (0<θ≦90°) with said longitudinal direction of the nano-trenches, whilst being separated two by two by a wall in second material.

The invention also concerns a method to form an imprint mould in three dimensions comprising at least:

a) the formation of alternate layers on a substrate, at least partly parallel to each other and at least partly perpendicular to the substrate, in a first type of material and in a second type of material, the first type of material able to be selectively etched relative to the second type of material, b) the formation, by partial selective etch of the first material relative to the second type of material, of portions of trenches or nano-trenches and of side walls, substantially perpendicular to said surface of the substrate, each trench or nano-trench comprising at least one first and one second level, respectively of depth h1 and h2>h1 in a direction perpendicular to the substrate measured relative to the top of the side walls.

Step b) may comprise the formation of a mask, on the alternate layers, which comprises at least one open region exposing one region of the alternate layers, at least part of the partial selective etching being made through the mask.

Advantageously, step b) comprises:

a first partial selective etch before formation of the mask, before formation of the mask, making it possible to etch at least part of the alternate layers in first type of material to depth h1, formation of the mask, a second partial selective etch through said open region of the mask, making it possible to etch part of the alternate layers in first type of material, already etched during the first partial selective etch to depth h1, down to depth h2>h1, removal of at least part of the mask.

In this first variant of a method according to the invention, selective etching of the first material relative to the second can be performed before depositing the mask. This then forms at least one trench or nano-trench whose bottom consists of the first material surrounded by walls consisting of the second type of material. The selective etching step, through the mask, then forms over-etched regions in each pre-existing trench or nano-trench of which part is exposed by the resin mask. Then, at the end of the method, the resin can be completely removed.

Several trenches or nano-trenches are formed during etching. Before deposit of the mask, an array of trenches is formed whose bottom, at a first depth level, is in a first material (depth h2), separated by patterns of high level (depth h1), consisting of second material.

As a variant, step b) comprises:

formation of the mask, a first sub-step of partial selective etching through said open region of the mask, making it possible to etch part of the alternate layers in first type of material to a depth $h_{int}$, removal of a first part of the mask, a second sub-step of partial selective etching, at least part of the alternate layers in first type of material etched during the first sub-step, then being etched to depth h2, and part of the alternate layers in first type of material covered by the mask during the first sub-step, then being etched to depth h1;

removal of a second part of the mask.

According to this variant of a method according to the invention, a first sub-step of partial selective etching takes place through said open region of the mask. There is then partial removal of the mask, for example on only one of the sides of the region opened in the mask. A second sub-step of selective etching of the first material relative to the second can then be added, enhancing the topology formed during the preceding selective etch step. This second sub-step of etching, at those points where etch of the layer in first material was not previously possible, extends each pre-etched portion of trench or nano-trench by at least one trench or nano-trench at a first level of depth surrounded by walls consisting of second type of material. The bottom of this or these nano-trenches consists of the first material. The second etch sub-step also takes place in the pre-etched region(s), thereby forming over-etched portions of nano-trenches having a second depth level. The over-etched regions are then surrounded by:

on a first side, by a trench or nano-trench in a longitudinal direction, parallel to the surface of the substrate, on a second side, opposite the first but always following said longitudinal direction, a wall formed in the first material, walls consisting of the second material following the direction perpendicular to said longitudinal direction.

Preferably, all the alternate layers have the same level before forming of the mask.

The region opened in the mask can form a trench in a single block, with two parallel edges, arranged following an axis forming an angle θ with the direction (X) of the length of the lines formed by the alternating layers, the portions of trenches etched in two adjacent layers, or the closest thereof since separated by a wall in second material, these layers being formed of the first type of material with a period P* between them following an axis formed by the longitudinal direction X extending the layers.

Further advantageously, in a device or method according to the invention, the period P* along axis X between two over-etched regions is greater than the minimal period which can be obtained for an array of patterns using standard optical lithography means.

In one method and one device of the invention, each trench and optionally each pattern or wall, has a thickness of between 1 nm and 50 nm, preferably between 5 nm and 30 nm. Advantageously, all the layers (trench or pattern) have the same thickness of about 10 nm+/−2 nm or 7 nm+/−2 nm or 5 nm+/−1 nm for example. Advantageously all the layers have a thickness of less than 20 nm.

h1 and h2 lie between a few nanometres and a few tens of nm, for example 50 nm.

The invention also concerns a method to form patterns in a resin, comprising an imprint in a layer of said resin, with a nano-imprint device such as described above: the device is pressed against and then into the resin until the resin completely fills the two levels of trenches or nano-trenches. The device can then be taken away leaving the desired imprint in the resin.

This therefore produces an imprint of positive type by pressing a mould according to the invention comprising patterns of negative-type, possibly having micrometric and/or nanometric dimensions, into a layer of resin deposited on the substrate to be structured. It is therefore possible to obtain patterns a few nanometres to several microns in width in a resin or a polymer, and then to transfer them into a substrate.

Said method may comprise the formation, on a substrate, of an array of nano-patterns in resin, comprising pads whose tops are located at a first height h'2 relative to a surface of said substrate, and patterns of height h1'<h'2 relative to the same surface and extending in a common direction of pattern extension.

Said method may also comprise the formation of contacts between said pads and of interconnection lines.

It is then effectively possible to connect the array of conductor patterns obtained by nano-imprinting using a device according to the invention by forming, for example using optical lithography means, an array of lines oriented locally along axis Y and perpendicular to the direction of elongation of the trenches above the pre-cited array. This array of lines preferably has a period of equal value to period P* of the portions of nano-trenches over-etched in the direction of the length of the nano-trenches. The regions of the mould having a deeper depth lead to forming higher pattern portions at the time of pattern formation by nano-imprint The contacting between the higher level (the pads, height h'2) and the patterns of height h'1 is then made on the pads, which avoids any formation of a via using optical lithography from setting up short circuits between two nano-patterns.

On one method or one device of the invention, the materials forming the alternating layers and/or forming the bottom and the sidewalls of the nano-trenches are chosen from among Si, SiGe, SiO2, HfO2, Si3N4, ZrO. For example, the pairs of materials chosen for the first material and second material may be Si/SiGe, Si/SiO2, or the pair HfO2/SiO2, or the pair SiO2/Si3N4, or the pair ZrO2/SiO2 or even pairs of metal materials. It is also possible to incorporate more than two materials from among those cited above, by choosing materials which can be etched selectively relative to one another so as to obtain variations in the individual depths of the nano-trenches for example, with respect to each other.

BRIEF DESCRIPTION OF THE DRAWINGS

FIGS. 1A to 1D comprise four photographs at four zoom levels, of a conventional structure allowing electric contact between an upper level and a lower level, consisting of nano-trenches obtained by nano-imprinting.

DETAILED DESCRIPTION OF PARTICULAR EMBODIMENTS

Figure 2A:
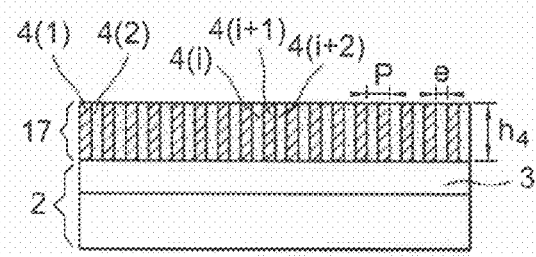
FIGS. 2A to 6C illustrate a method according to the invention, in which the etching of the nano-trenches is made after deposit and removal of the resin.
Figure 2B:
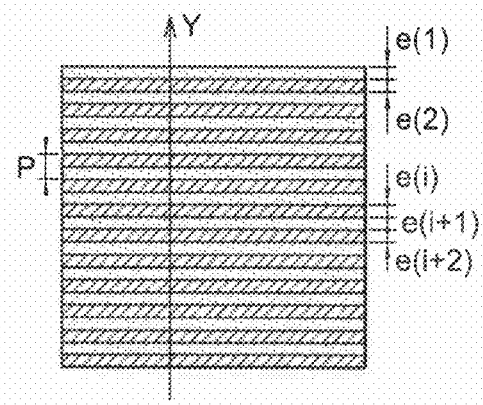

Embodiments of methods according to the invention are shown FIGS. 2A to 10C, in which FIG. A is an overhead view, FIG. B a cross-section of FIG. A along axis Y, and FIG. C is cross-section of FIG. 1 along axis X, the axes X and Y being two axes defining a plane parallel to the surface of the substrate or of the device.

First a substrate 2 is chosen which may be in semiconductor material for example, or in nickel or in quartz or any other suitable material.

This substrate has a surface which defines a plane XOY, or main plane of the substrate.

On this substrate 2 at least one composite layer 17 is formed containing "n" layers 4(i), i=1 . . . n, (FIGS. 2A and 2B), parallel to each other and all substantially perpendicular to plane xOy. For the methods and devices presented, a surface layer 3 in oxide may be sandwiched between the composite layer and the substrate. Alternatively, the device does not contain any surface layer 3.

The layers 4(i) consist alternately of two types of materials which can be etched selectively relative to one another. Etching is said to be selective between two materials if, for etching (e.g. chemical, wet or dry) one of the two materials is etched at a substantially faster etch speed (for example 10 times or 100 times faster) than the etch speed of the other material.

The composite layer 17 has a height h4 measured in a direction Z substantially perpendicular to the surface of the substrate 2. The alternation period P, between two layers 4(i) and 4(i+2) consisting of the same type of material, is equal to the sum of the thickness e(i) of a layer in first material and the thickness e(i+1) of a layer in second material.

Preferably, for one same type of material, the thicknesses of the different layers are identical. The thickness of each layer lies between 1 nm and 20 nm for example, advantageously between 1 nm and 10 nm. Advantageously, all the layers 4(i) have an identical thickness e(i), for example of 10 nm; if there are two materials, the period P is then equal to 2*e, for example 20 nm.

By way of example, the first and second materials can respectively be in SiGe and in Si. The first and second materials can, conversely, respectively be Si and SiGe. Other pairs of materials are possible such as described below. There may optionally be more than two types of materials forming the alternating layers 4(i), each type of material able to be etched selectively relative to the others.

The layer 17 can be formed for example using a method of the type described in U.S. Pat. No. 6,759,180 B2, and therefore comprises a successive sequence, in predefined trenches, of a step for a conforming deposit of oxide used to narrow the initial trench until a thickness e is reached, then a step to fill the trenches of thickness e with silicon, followed by polishing and etching steps of the oxide. Each cycle allows a pattern in silicon to be formed in a pre-existing trench, thereby forming two new trenches separating the new pattern, of width e, from the walls of the pre-existing trench.

It is possible to perform several succeeding cycles by choosing oxide thicknesses, for each cycle, so as to obtain thicknesses e in the order of 5 nm to 50 nm, to form an array of n patterns of thickness e, separated by trenches of thickness e. By not performing an oxide etching step in the last cycle, it is possible to obtain a composite layer structure 17 of the type presented above, which can be used in a method of the invention. The two materials forming the layers $4(i)$ are then Si and SiO2.

A second example of a method to form a composite layer 17 is illustrated FIGS. 15A to 15E.

Figure 15A:
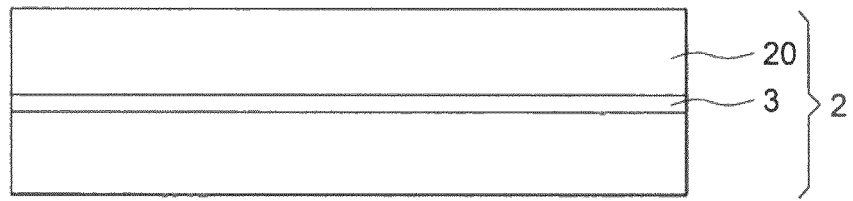
FIGS. 15A-15E illustrate a method to form a composite layer.

The formation of the composite layer, in this example, uses a substrate of semiconductor on insulator type i.e. a substrate comprising a buried insulator layer 3 separating a thin surface layer 20 of height h, in semiconductor material, from a thick substrate 2 ensuring the rigidity of the assembly (FIG. 15A). The material of the buried insulator layer 3 is chosen so as to limit and/or prevent the deposit of materials forming the alternate layers $4(i)$.

This insulator layer can advantageously be in silicon oxide and the surface film in silicon.

Figure 15B:
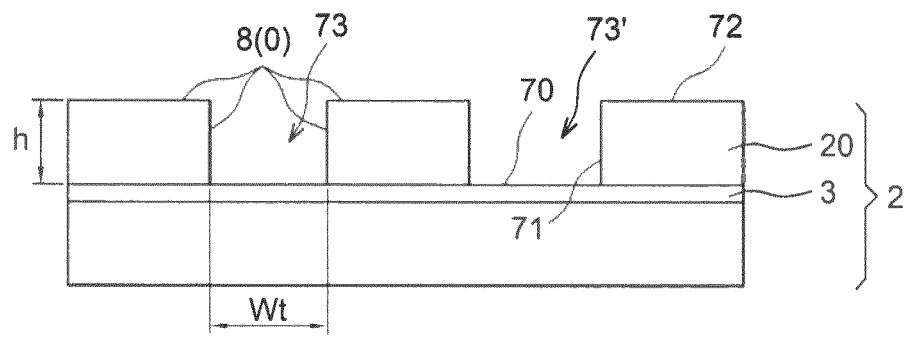

One or more trenches 73, 73', of width $W_t$, of depth h, are etched in the surface layer 20, for example by photolithography. The buried insulator layer 3 forms an etch stop layer. The bottom of the trenches 73 therefore consists of layer 3 in insulator material (FIG. 15B). A distinction can then be made between three types of surfaces on or in the substrate: the trench bottoms 70, the sidewalls 71 of the trenches and the top 72 of the substrate (the upper part of the substrate 2 which is not affected by etching of the trenches).

The material forming the buried insulator layer 3 therefore forms the bottom of the trenches which does not allow the deposit of materials intended for the conforming alternate layers $4(i)$, and the active deposit surface $8(0)$ i.e. a surface in a material compatible with the deposit of chosen materials for the alternate layers $4(i)$ is formed by the top 72 of the substrate and by the sidewalls 71 of the trenches 73. This active surface therefore consists almost solely of surfaces of the surface layer 20.

Figure 15C:
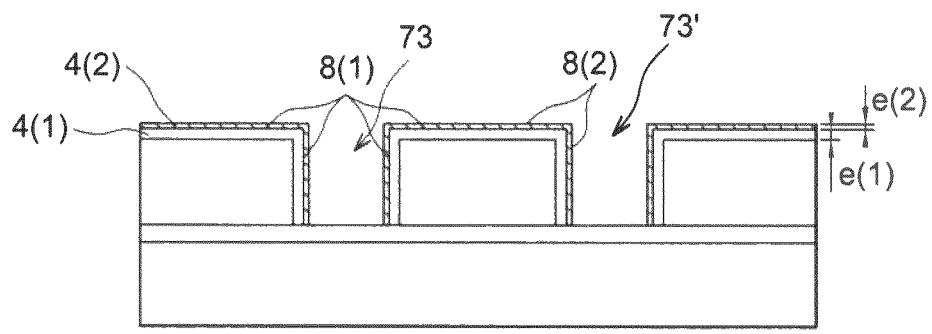

A thickness $e(1)$ of a first layer $4(1)$, of low roughness and in a first type of material, is deposited conforming fashion over the entire surface $8(0)$ (FIG. 15C). In general, the term conforming layer means a layer following the topology of the surface $8(0)$ on which it is deposited. This first type of material is chosen so that it can be etched selectively relative to the substrate 2. It is in SiGe for example. This layer has a free surface $8(1)$.

Next, on this surface $8(1)$ in a first material, a conforming layer $4(2)$ is deposited of low roughness and of thickness $e(2)$ in a second material (FIG. 15C). The material of the layer $4(2)$ is chosen so that it can be etched selectively relative to the material of layer $4(1)$. Generally, in the entirety of this present application, etching is said to be selective between two materials if, during the etch step, the speed of etching of one of the two materials is substantially faster than the etch speed of the other material, for example 10 to 1000 times faster. Preferably the material of layer $4(2)$ is etched as the same speed as the substrate 2, advantageously this material is the same as the substrate material, and is silicon for example.

Figure 15D:
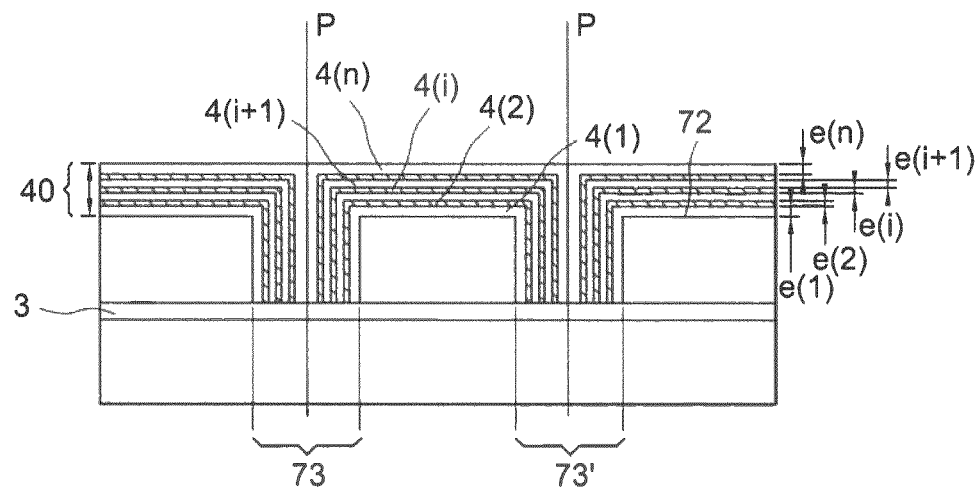
Figure 15E:
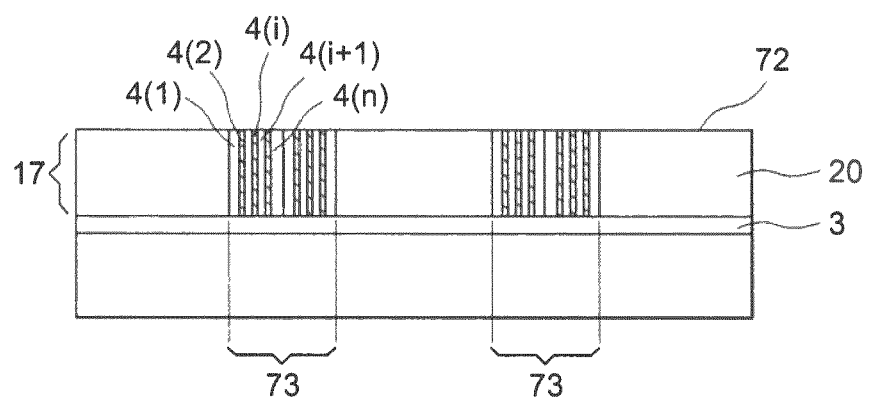

These steps are repeated so as to obtain n conforming layers $4(1)$ to $4(n)$ of thickness $e1$ to $e(n)$ forming a composite film 40 of thickness $h_n$ over the whole topology (FIG. 15D). Layer $4(i+1)$ is deposited on the surface $8(i)$ of layer i; layer $4(i+1)$ being in the type of material chosen so that it can be selectively etched relative to the type of material forming the underlying layer $4(i)$.

This gives rise to an alternation of the two above-cited materials which can be etched selectively with respect to each other:

the uneven layers $4(1)$ to $4(2x+1)$ consisting of the first material, and the even layers, which are deposited alternately with the uneven layers and are formed in the second material. These even layers are referenced $4(2)$ to $4(2x)$, or $4(2)$ to $4(2x+2)$, depending on whether there the total number of layers deposited on the substrate is even or uneven Each of the thicknesses $e(1)$ to $e(n)$ is between a few nanometres and a few tens of nanometres, for example between 1 nm and 50 nm, preferably between 5 nm and 30 nm.

Advantageously all the layers have one same thickness, for example about 10 nm+/−2 nm.

The deposit of each layer can be made by CVD for example (notably by epitaxy) or PECVD.

The presence of the insulator material 3, forming the bottom of the trenches, does not allow the deposit of alternate conforming layers (FIG. 15D). There is therefore no depositing of layers $4(i)$ following the bottom of the trenches. The portions of alternate layers present in the trenches 73, 73' are solely oriented perpendicular to the mean plane of the substrate 2 and are deposited at least following the two sidewalls 71 of each trench 73 symmetrically relative to the plane $P_t$ passing through the centre of each trench 73.

If some trenches 73 are not completely filled with the composite layer 40, the unfilled parts of these trenches are advantageously filled with a filler material chosen so that it can be etched selectively relative to the type of material forming the last conforming layer $4(n)$ of the stack 40. Advantageously this last conforming layer $4(n)$ is such that the filler material can be etched at a speed close to the etch speed of the substrate material. For example the filler material is a material of the type forming the substrate.

Next, the device is thinned, for example during chemical mechanical polishing, so as to remove at least those portions of the composite layer 40 above the field 72 of the substrate and thereby obtain a device in which the alternation of two materials, which can be etched selectively relative to one another, is only present in the regions corresponding to the trenches 73, 73' (FIG. 4E).

A composite layer 17 can therefore be formed, in this example comprising two arrays of alternate layers $4(i)$ lying in wide trenches 73, separated by portions in material of the substrate 20. Each array of alternate layers $4(i)$, in this example, consists of alternating layers of Si and layers of SiGe. It is possible to obtain this alternation of layers with other pairs of materials and even with more than 2 different materials, having different etch speeds, notably chosen from among the above-cited materials.

One embodiment of a method according to the invention is described in FIGS. 3A to 6C.

The starting material is a structure comprising a substrate 2 provided with at least one composite layer 17 containing n layers $4(i)$, i=1 . . . n. This structure and examples of embodiment of methods to form this structure have already been described above notably with reference to FIGS. 2A and 2B and 15A to 15E.

Figure 3A:
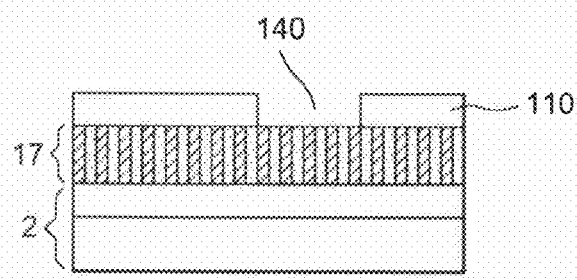
Figure 3B:
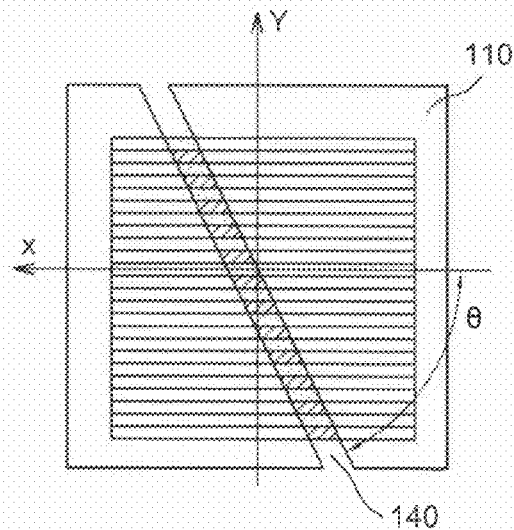

A lithography mask 110 is deposited on the composite layer 17 of alternate layers (FIGS. 3A and 3B). This mask can be in photolithography resin and will be called resin in the remainder of the description. An open region 140 is formed by removing the resin in the region not covered by the mask. This open region therefore locally exposes the alternation of layers 4(i). Advantageously, this open region in the resin, along plane XY, has the shape of a trench 140 of width W. The walls of this trench are rectilinear, perpendicular to plane XY, parallel to each other and form an angle θ (0<θ≦90°) with the local direction X of the alternate layers 4(i). In the trench 140, the length L', measured along axis X, of the portion of each layer 4(i) not coated with the resin 110 then equals W/(cos 90−θ).

Figure 4A:
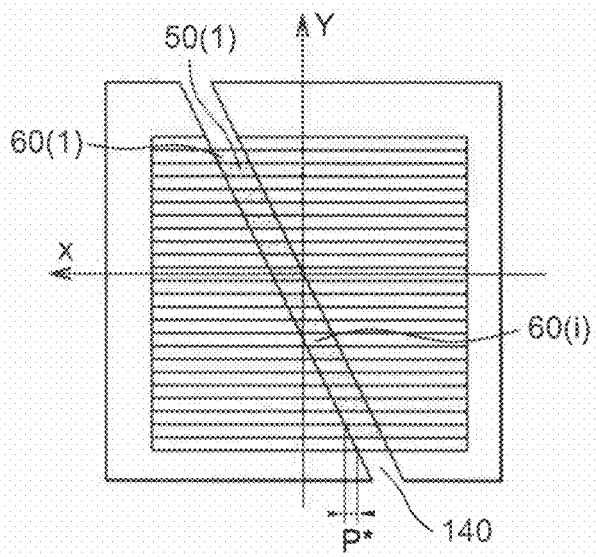
Figure 4B:
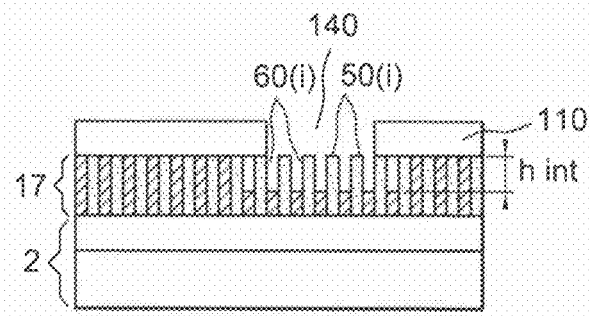
Figure 4C:
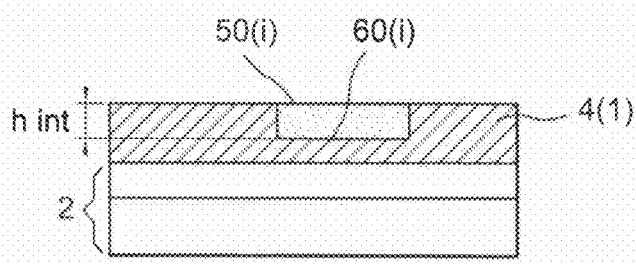
Figure 5A:
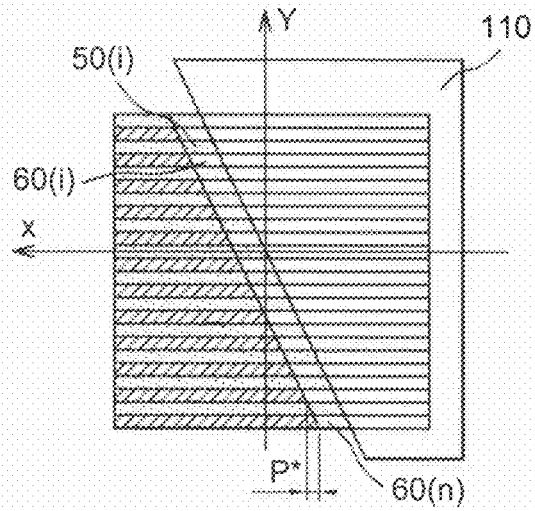
Figure 5B:
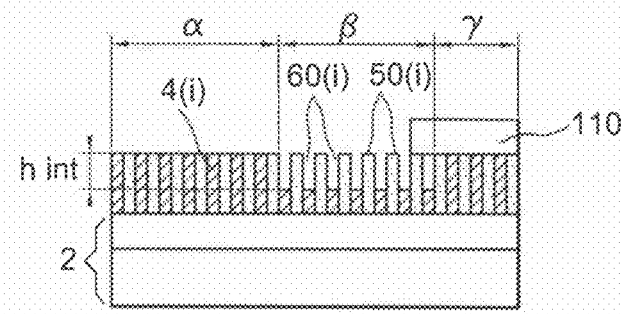

Selective etching is then carried out of one of the two types of material (FIGS. 4A, 4B and 4C). As an example, the etched material is preferably the first material. The etching of this first material leads to local forming, in layers 4(i) in first material, of portions of trenches or nano-trenches 60(i) at an intermediate depth $h_{int}$ (for example in the order of a few tens of nm), two nano-trenches being separated by walls 50(i) consisting of the second type of material. This second type of material can also be etched, but to a lesser extent than the first. The level of the tops of the walls 50(i) separating the nano-trenches 60(i) will be denoted "high level" in the remainder hereof. Here; and in all the present document, the depths $h_i$ (i=int, 1, 2, . . . ) are measured relative to the surface of the layers in second material, which are less affected by the etching than the layers in the first material.

In the advantageous case when there is an opening in the resin 110 in the form of a trench 140 having an angle θ relative to the local direction X of the alternate layers, a periodicity P* is formed along axis X between two portions of pre-etched nano-trenches 60(i) present on two adjacent alternate layers in first material 4(i) and 4(i+2). P* is then such that P*=p/tan(θ).

In this example, etching is isotropic, the first material is locally etched underneath the layer of resin 110 (FIGS. 4A, 4B and 4C) and the length L of the portions of pre-etched nano-trenches is then strictly more than L', the length along axis X of the portion of each layer 4(i) not coated with the resin 110.

Alternatively, etching can be anisotropic and only etches the portions of the first type of material not coated with the resin 110. The length L of the portions of pre-etched nano-trench is then equal to length L'. This configuration is illustrated in the following embodiment.

After etching, a portion of resin 110 is removed (FIGS. 5A and 5B), this removed portion is preferably the resin present on only one of the sides of the opened region 140. The device then comprises at least three regions:
one region (α), in which there has not yet been any etching and in which the layers 4(i) consisting of the first type of material are at the level of the layers in the second type of material,
a region (β), which corresponds to the shape of the trench 140, containing the portions of pre-etched nano-trenches 60(i) having an intermediate depth $h_{int}$,
a region (γ), coated with resin 110, in which there has not been any etching and in which the layers 4(i) consisting of the first type of material are at the level of the layers in a second type of material.

Next, a second selective etching step of the first type of material is conducted. The first type of material is then etched at every point of the alternating layers 4(i) which is not coated with resin 110, i.e. in portions (α) and (β).

All these points are then etched to a same depth h1. This leads to forming:
nano-trenches 6(i) of depth h1 in the layers in first material of region (α) initially having a high level, equal to the level of the layers in second material;
portions of deeper nano-trenches 60(i) having a depth h2 such that h2=h1+$h_{int}$ in the portions of pre-etched nano-trenches 60(i) of region (β).

Those parts of the layers formed of the first type of material belonging to region (γ) are coated with resin 110 and are therefore not etched.

Figure 6A:
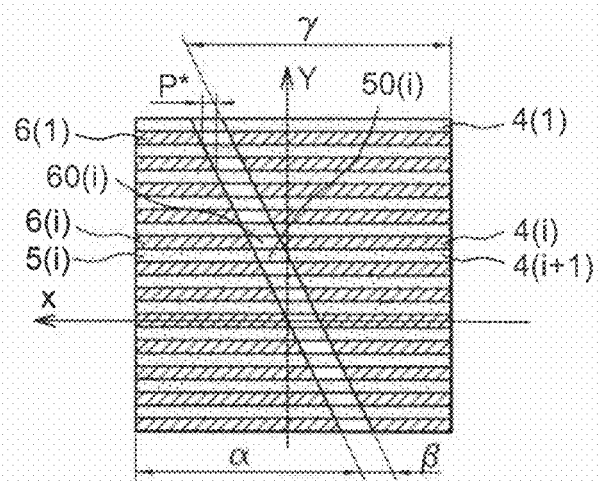
Figure 6B:
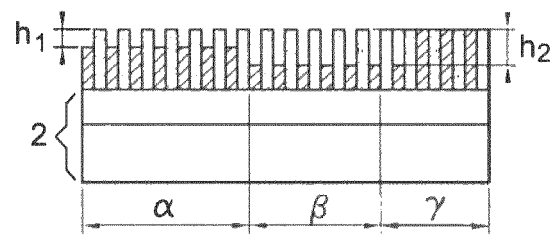
Figure 6C:
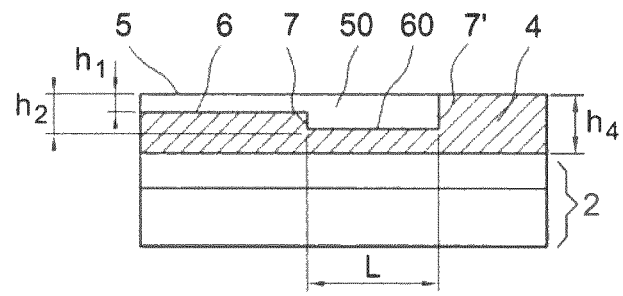

Finally, the remaining resin 110 is removed (FIGS. 6A, 6B and 6C). The over-etched regions 60(i) of depth h2, in the direction of the length of the alternation of layers 4(i), then have on one side a trench or nano-trench 6(i) of depth h1, and on the other side a wall consisting of the first type of material whose level is identical to the level of the layers consisting of the second type of material. FIG. 6C shows a cross-section along axis X for any trench or nano-trench 6 in the device.

The array of alternate layers then comprises three regions:
a "deep" region (β) consisting of an alternation of portions of nano-trenches 60(i) of depth h2, separated by walls 50(i) consisting of the second type of material; this region has the geometric characteristics already indicated above: a width W and an angle θ with the local direction X of the alternate layers 4(i), the portions of depth h2 having a period P* along this axis X,
on one side of the deep region, an array (a) of nano-trenches 6(i) of depth h1, whose bottom consists of the first type of material, separated by walls 5(i), of high level consisting of the second type of material,
on the other side of deep region, an array (γ) of alternate layers 4(i) having the same local axis of direction of the layers as the array of nano-trenches, each of the alternate layers 4(i) having one same height h4, identical to the initial height, before etching, of the layers 4(i).

Another embodiment of a method according to the invention is described in FIGS. 7A to 10C.

The starting material is a structure comprising a substrate 2 provided with at least one composite layer 17 containing n layers 4(i), i=1 . . . n. This structure and examples of embodiment of methods to obtain this structure have already been described with reference to FIGS. 2A and 2B and 15A to 15E.

Figure 7A:
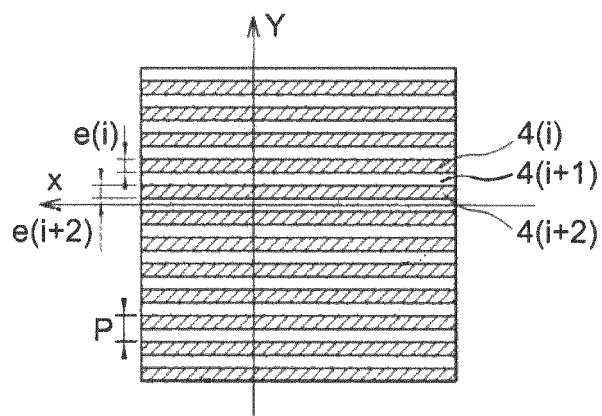
FIGS. 7A to 10C illustrate a method according to the invention, in which the etching of the nano-trenches is made before deposit of the resin.
Figure 7B:
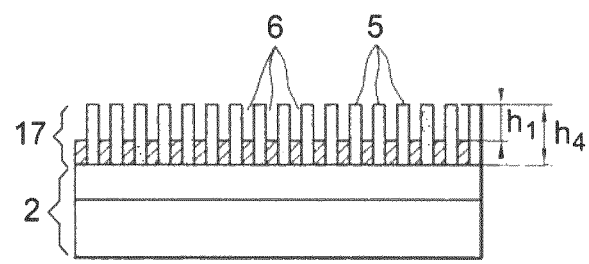

A selective etch step is then performed of one of the two types of material (FIGS. 7A and 7B). Here again, as an example, the material preferably etched is the first type of material. This first type of material is etched at every point of the alternation of layers 4(i) so as to form trenches or nano-trenches 6(i) of depth h1, separated from each other by walls 5(i) consisting of the second type of material. The widths of the nano-trenches 6(i) and of the walls 5(i) separating them are respectively equal to the thicknesses of the alternate layers consisting of the first type of material and the thicknesses of the layers consisting of the second type of material. The bottom of the nano-trenches 6(i) consists of the first type of material.

Figure 8A:
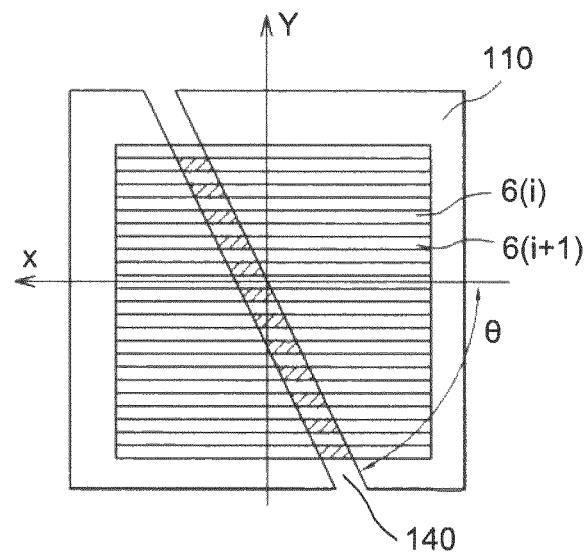
Figure 8B:
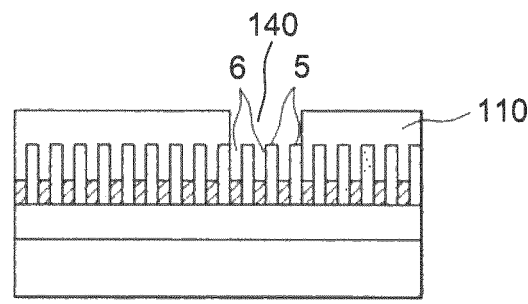

On this array of nano-trenches 6(i) a lithography mask 110 is deposited (FIGS. 8A and 8B). This mask may be in photolithography resin. An open region 140 is formed by removing the resin in this region. This region therefore locally exposes the alternation of layers 4(i), particularly the material forming the bottom of the nano-trenches 6(i).

Advantageously, the open region forms a trench 140 in the mask 110, the trench being of width W and angle θ (0<θ90°) with the local direction X of the alternate layers 4(i) and of the nano-trenches $6(i)$. In the trench 140 the length L', measured along axis X, of the portion of each layer $4(i)$ not coated with the resin 110 is then equal to W/cos 90−θ). The walls of this trench are rectilinear, perpendicular to plane XY, parallel to each other and form an angle θ (0<θ≦90°) with the local direction X of the alternate layers $4(i)$.

Here again, the angle θ between the resin trench 140 and the local direction X of layer alternation leads to the existence of a period P* following axis X between two portions of over-etched nano-trenches $60(i)$ present in two adjacent nano-trenches $6(i)$. P* is then such that P*=P/tan(θ).

Figure 9A:
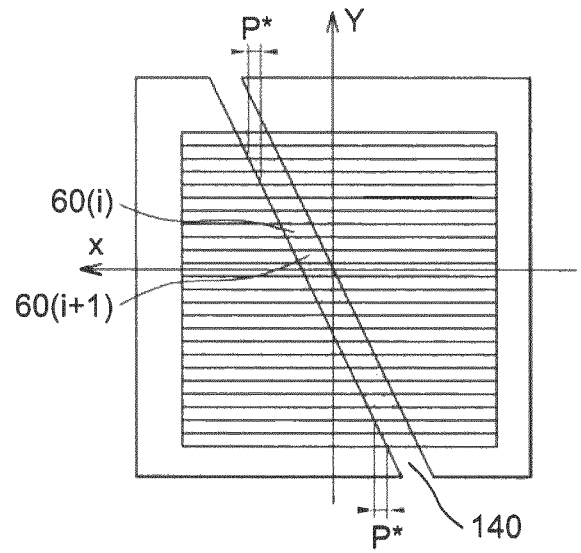
Figure 9B:
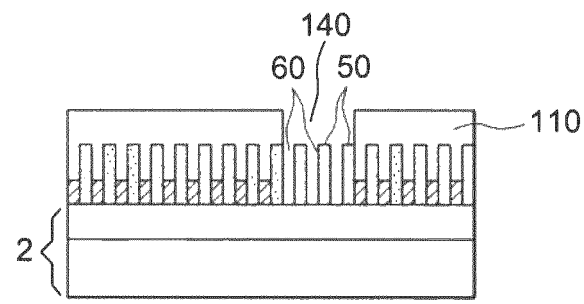
Figure 9C:
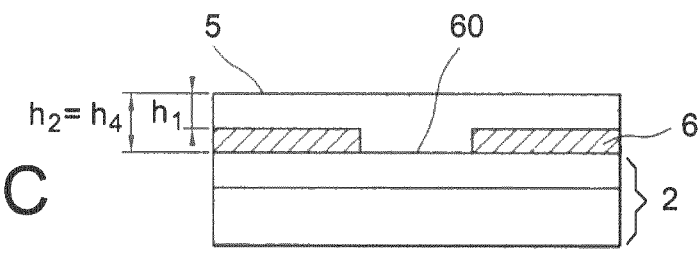

Selective etching is then conducted of the first type of material locally forming, in the nano-trenches $6(i)$ in first material, an over-etched portion of nano-trench $60(i)$ of depth h2 relative to the high level of the top of the walls consisting of the second type of material (FIGS. 9A, 9B and 9C). In the case presented here, by way of example, the depth h2 of the over-etched regions is equal to the total thickness h4 of the layers $4(i)$ consisting of the second material and forming the walls $5(i)$.

Advantageously, etching can be anisotropic and then etches solely those portions of the first type of material not coated with the resin (FIGS. 9A, 9B and 9C); the length L of the portions of over-etched nano-trenches $60(i)$, measured along axis X, is then equal to the length L' along axis X of the portion of each layer $4(i)$ not coated with the resin 110.

Alternatively, as presented in the preceding embodiment, etching can be isotropic, the first material then being locally etched underneath the resin layer. The length L of the portions of over-etched nano-trenches is then greater than L'.

Figure 10A:
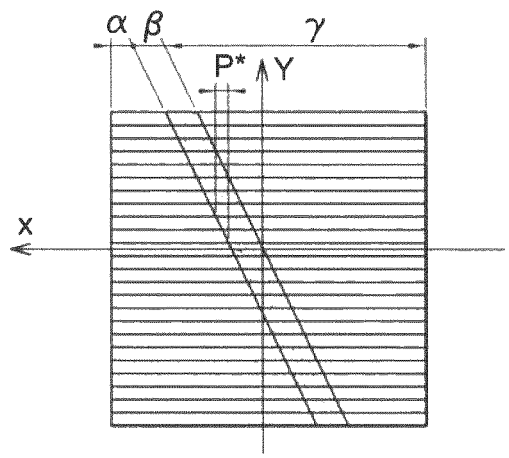
Figure 10B:
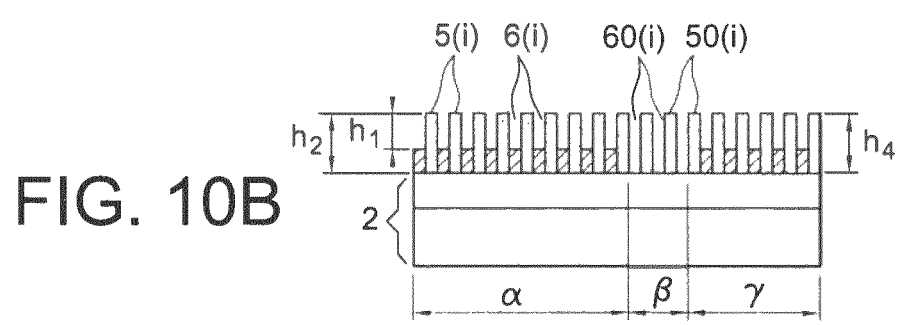
Figure 10C:
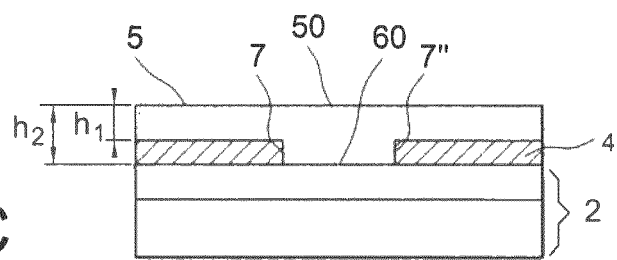

Next, the remaining resin 110 is removed (FIGS. 10A, 10B and 10C). The over-etched regions $60(i)$ of depth h2, in the direction of the length of the alternation of layers, are then each contained in a nano-trench $6(i)$ of depth h1.

A structure is therefore formed comprising at least one nano-trench of depth h1 of which one part has a depth h2. With respect to an array of alternate layers $4(i)$, an array of nano-trenches $6(i)$ is formed having a depth h1 and, in each nano-trench, a portion $60(i)$ of depth h2 of length L and such that along axis X of the nano-trenches, there is a periodicity P* between two over-etched portions $60(i)$ present in two adjacent nano-trenches $6(i)$.

The array of alternate layers then comprises three regions (FIG. 9A):
- a "deep" region (β) consisting of an alternation of portions of nano-trenches $60(i)$ of depth h2 separated by walls $50(i)$ consisting of the second type of material; this region has the geometric characteristics already indicated above: a width W and an angle θ with the local direction X of the alternate layers $4(i)$, the portions of depth h2 having a period P* along this axis X,
- on each side of the deep region, an array (α and γ) of nano-trenches $6(i)$ of depth h1, whose bottom consists of the first type of material, separated by walls $5(i)$, of high level, consisting of the second type of material.

The invention also concerns two devices, illustrated FIGS. 11A to 12C. The denotations and symbols (P, P*, h1, h2, . . . etc.) used in the remainder hereof have the same meaning as previously. With regard to the presented methods and devices, a surface layer 3 in oxide may lie between the composite layer and the substrate. Alternatively, the device does not contain any surface layer 3.

One first embodiment of a device according to the invention comprises at least one nano-trench of depth h1 relative to the high level of the edges of the trench, whose bottom consists of a first material. The walls of this trench consist of a second type of material.

Figure 11A:
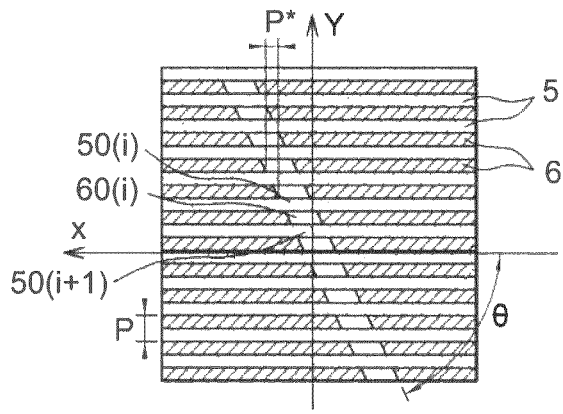
FIGS. 11A-11C illustrate a device according to the invention comprising over-etched regions at the end of the nano-trenches.
Figure 11B:
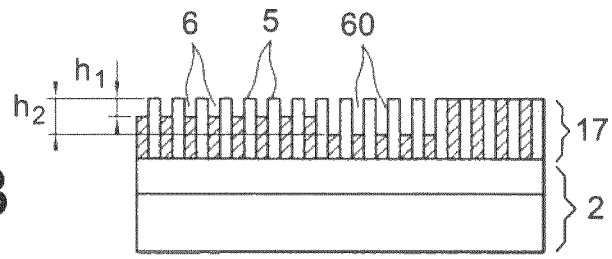
Figure 11C:
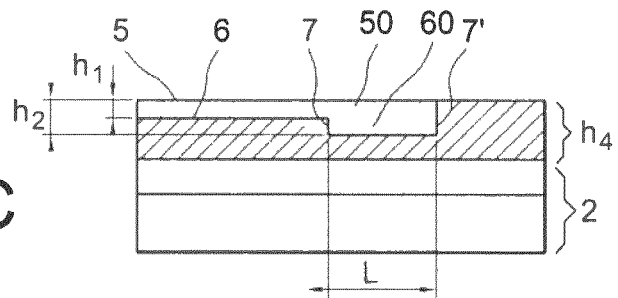

Advantageously, the device contains several nano-trenches $6(i)$, arranged in an array in which the wall $5(i)$/nano-trench $6(i)$ alternation has a period P (FIGS. 11A, 11B and 11C). The widths of the walls $5(i)$ are preferably equal; the widths of the nano-trenches $6(i)$ are preferably equal to each other. The widths and the period of the walls $5(i)$ and of the nano-trenches $6(i)$ are those already indicated for the alternate layers $4(i)$ with reference to FIG. 2A.

At least at one end of each nano-trench $6(i)$, there is a length L of over-etched region $60(i)$ of depth h2.

The over-etched region(s), of depth h2, are surrounded by four walls.

The two walls $50(i)$ and $50(i-1)$ present in the direction perpendicular to the main direction of the nano-trenches $6(i)$ consist of the second type of material, and have a height h2 measured from the bottom of the portion of over-etched nano-trench $60(i)$ and in direction Z.

Along the main direction X of the nano-trenches, the walls of the over-etched region consist of the first type of material. On the side of the nano-trench $6(i)$ of depth h1, the wall 7 has a height of value h2-h1. On the other side, the wall 7' has a height h2 and its highest level corresponds to the high level of the walls $50(i)$ consisting of the second type of material.

If there are several nano-trenches $6(i)$, there is at least one portion of over-etched nano-trench $60(i)$ present at one end at least of each nano-trench $6(i)$. The nano-trenches $6(i)$ have their over-etched portion $60(i)$ on the same side. The walls $7(i)$ or $7'(i)$ in first material of these trenches can advantageously be offset from each other so that they are aligned in a direction forming an angle θ (0<θ≦90°) with direction X. There is then, along the axis of the local direction X of the nano-trenches $6(i)$, a period P* (such as already defined above) between two walls $7'(i)$ of height h2 of two over-etched regions $60(i)$ and $60(i+1)$ present at the end of two adjacent nano-trenches $6(i)$.

A second embodiment of a device according to the invention comprises at least one nano-trench of depth h1 relative to the high level of the edges of the trench, whose bottom consists of a first material. The walls of this nano-trench consist of a second type of material.

Figure 12A:
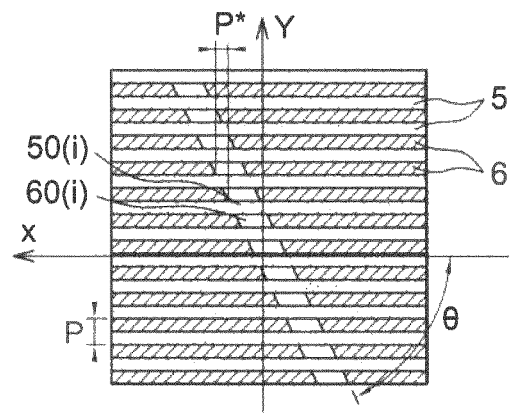
FIGS. 12A-12C illustrate a device according to the invention comprising over-etched regions in the middle of the nano-trenches.
Figure 12B:
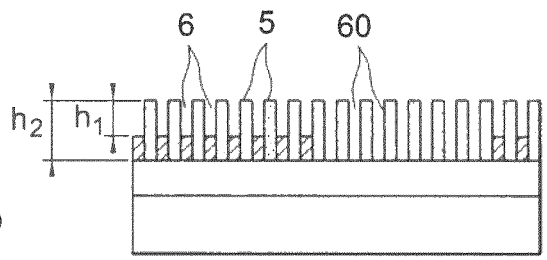
Figure 12C:
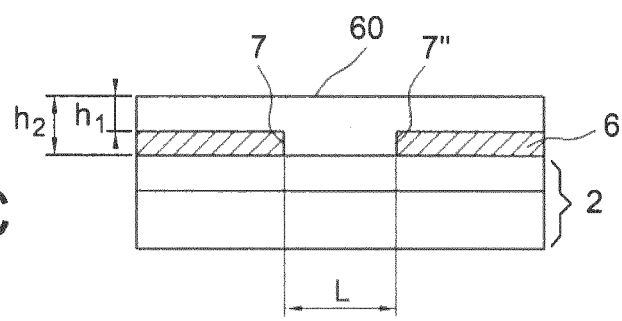

Advantageously, the device contains several nano-trenches $6(i)$, arranged in an array in which the wall $5(i)$/nano-trench $6(i)$ alternation has a period P (FIGS. 12A, 12B and 12C). The widths of the walls $5(i)$ are preferably equal; the widths of the nano-trenches $6(i)$ are preferably equal to each other. The widths and the period of the walls $5(i)$ and of the nano-trenches $6(i)$ are those already indicated above for the alternate layers $4(i)$ in connection with FIG. 2A.

In at least each nano-trench $6(i)$, there is a length L of over-etched region $60(i)$ of depth h2.

The over-etched region(s) $60(i)$, of depth h2 are surrounded by four walls:
- the two walls $50(i)$ and $50(i-1)$ present in direction Y perpendicular to the main direction of the nano-trenches $6(i)$ consist of the second type of material, and have a height h2 measured from the bottom of the portion of over-etched nano-trench $60(i)$ and in direction Z.
- along the main direction X of the nano-trenches, the two walls of the over-etched region consist of the first type material, and from these two sides each over-etched region $60(i)$ is extended by a nano-trench $6(i)$ of depth h1. The two corresponding walls $7(i)$ and $7''(i)$ have a height of value h2-h1.

If there are several nano-trenches $6(i)$, there is at least one portion of over-etched nano-trench $60(i)$ present in each nano-trench $6(i)$. The walls $7(i)$ or $7''(i)$ in first material of these trenches may advantageously be offset from each other so that they are aligned in a direction forming an angle θ (0<θ≦90°) with direction X. Along the axis of the local direction X of the nano-trenches $6(i)$, this then gives a period P* (such as defined above) between two walls $7(i)$ of two over-etched regions $60(i)$ and $60(i+1)$ present in two adjacent nano-trenches $6(i)$.

In one method or one device of the invention, the materials forming the alternation of alternate layers $4(i)$ are chosen from among Si, SiGe, SiO2, HfO2, Si3N4, ZrO; for example the pairs of materials chosen for the first material and the second material can be Si/SiGe, Si/SiO2, or the pair HfO2/SiO2, or the pair SiO2/Si3N4, or the pair ZrO2/SiO2 or even pairs of metal materials. In each case, it is possible for either one of the two materials to be preferably etched.

It is also possible to incorporate more than two materials from among those cited above, by choosing materials which can be etched selectively relative to one another, so as to obtain variations in individual depths of the nano-trenches with respect to each other. It is also possible to choose types of materials so that there can be variations in composition, and hence in etch speed, between two layers consisting of one same type of material.

In a device according to the invention and/or fabricated according to a method of the invention, the trenches $6(i)$ and $60(i)$ and the walls $5(i)$ and $50(i)$ have thicknesses of between 1 nm and 50 nm, preferably between 5 nm and 30 nm. For example, the layers have one same thickness of about 10 nm+/−2 nm or even 7 nm+/−2 nm, or further 5 nm+/−1 nm.

A device according to the invention and a method according to the invention are advantageously such that the period P* along axis X between two over-etched regions $60(i)$ and $60(i+1)$ is greater than the minimal period which can be obtained for an array of patterns using standard optical lithography means.

Figure 13:
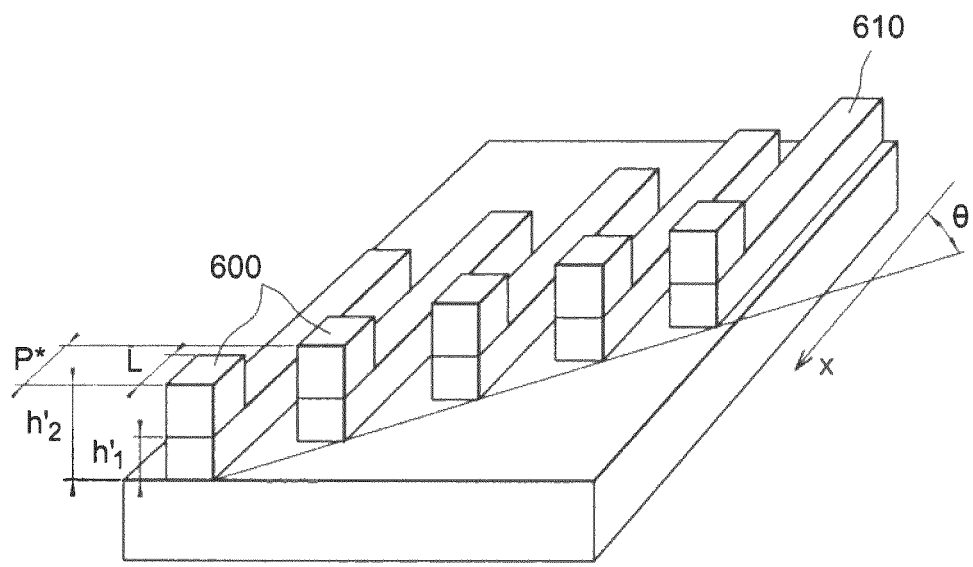
FIG. 13 illustrates the patterns obtained by nano-imprinting a device according to FIG. 11.

A device of the invention and/or fabricated according to a method of the invention can effectively be used as mould to produce patterns by nano-imprint in a layer of polymer coating a "product" substrate, or as negative to form nano-imprint moulds (FIG. 13).

The patterns 610 and 600 then obtained have two different levels h1' and h2' respectively corresponding to the regions of nano-trenches and to the regions of over-etched nano-trenches of the nano-imprint mould. The regions of the mould having a greater depth lead to forming higher portions of patterns 600 at the time of forming patterns by nano-imprint.

Figure 14:
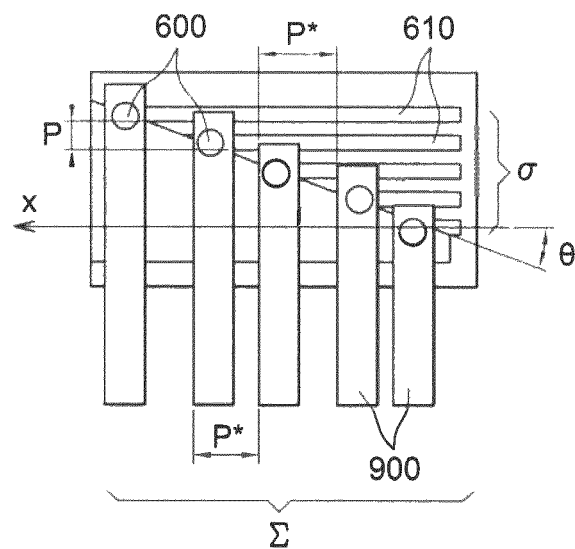
FIG. 14 illustrates the connecting mode of patterns obtained by nano-imprinting a device according to FIG. 11 with a higher electric level.

Should the period P* be greater than the minimal period which can be obtained for an array of patterns using standard optical lithography means, after the formation of an array "σ" of patterns 610 by nano-imprinting, it is possible to connect the array "σ" of conductive patterns to a higher level (FIG. 14). This contacting is possible, using optical lithography means, by forming an array "E" of lines 900 locally oriented along axis Y, of period equal to the period P* of the portions of over-etched nano-trenches, and positioned so as to be contacted with the portions of raised patterns 600.

The contacting between the higher level "Σ" and the level of nano-trenches "σ" is therefore made on the pads formed by the raised patterns 600, which avoids any creation of short circuits between two nano-patterns 610 when a via is formed by optical lithography means.

The invention claimed is:

1. A nano-imprint device comprising at least:
a substrate, having a surface,
on the substrate, a plurality of nano-trenches parallel two by two, each nano-trench extending in a longitudinal direction and being delimited in a lateral direction by side walls, the nano-trenches and the side walls being directed substantially perpendicular to said surface of the substrate, each nano-trench comprising a bottom surface,
in a cross-sectional view along the longitudinal direction, the bottom surface of each nano-trench has at least one first and one second level in a direction perpendicular to the substrate, respectively of depth h1 and h2>h1, measured relative to the top of the side walls,
in a cross-sectional view along the lateral direction, the bottom surface of each nano-trench has only one level that is at the depth h1 or h2, and
the bottom surfaces of the nano-trenches, of the least deep level h1 being in a first material, the side walls being in a second material.

2. The device according to claim 1, wherein said plurality of nano-trenches separated by side walls form an array of patterns and of nano-trenches, each portion of nano-trench of depth h2 being offset from a portion of an adjacent nano-trench by a period P*, in said longitudinal direction.

3. The device according to claim 1, wherein deepest parts, of depth h2, of the nano-trenches have a length shorter than period P*.

4. The device according to claim 1, wherein each deep part of depth h2 lying at one end of a nano-trench is delimited by four faces,
one face in said first material, of height h2−h1,
two faces formed by two side walls of said second material, and
one face of said first material, of depth h2, and whose top is at a same level, or substantially at a same level, as a top of the side walls surrounding the nano-trench.

5. The device according to claim 1, wherein a width of the nano-trenches is equal to or less than 10 nm+/−2 nm.

6. The device according to claim 1, wherein each nano-trench with depth h1 is disposed in a first region and each nano-trench with depth h2 is disposed in a second region, different from the first region and adjacent to the first region.

7. The device according to claim 1, wherein the bottom surface of each nano-trench, in both the longitudinal direction and the lateral direction, only includes said first material.

8. A nano imprint device comprising at least:
a substrate, having a surface,
on this substrate, a plurality of nano-trenches parallel two by two, each nano-trench extending in a longitudinal direction and being delimited laterally by side walls, the nano-trenches and the side walls being directed substantially perpendicular to said surface of the substrate, each nano-trench comprising at least one first and one second level in a direction perpendicular to the substrate, respectively of depth h1 and h2>h1, measured relative to the top of the side walls, and
a bottom of the nano-trenches, of the least deep level h1 being in a first material, the side walls being in a second material, the first material able to be etched selectively relative to the second material forming the walls of the nano-trench, and
said plurality of nano-trenches separated by side walls forming an array of patterns and of nano-trenches, each portion of nano-trench of depth h2 being offset from a portion of an adjacent nano-trench by a period P*, in said longitudinal direction.

9. The device according to claim 8, wherein deepest parts, of depth h2, of the nano-trenches have a length shorter than period P*.

10. The device according to claim 8, wherein each deep part of depth h2 lying at one end of a nano-trench, and is delimited by four faces, one face in said first material, of height h2−h1,
two faces formed by two side walls of said second material,
one face of said first material, of depth h2, and whose top is at same level, or substantially at same level, as a top of the side walls surrounding the nano-trench.

11. The device according to claim 8, wherein a width of the nano-trenches is equal to or less than 10 nm+/−2 nm.

\* \* \* \* \*

UNITED STATES PATENT AND TRADEMARK OFFICE
CERTIFICATE OF CORRECTION

PATENT NO. : 8,486,514 B2
APPLICATION NO. : 12/715738
DATED : July 16, 2013
INVENTOR(S) : Stefan Landis et al.

It is certified that error appears in the above-identified patent and that said Letters Patent is hereby corrected as shown below:

Title Page, Item (73), the Assignee's Information is incorrect. Item (73) should read:

--(73) Assignee: Commissariat a l'Energie Atomique, Paris (FR)--

Signed and Sealed this
Seventeenth Day of September, 2013

Teresa Stanek Rea
*Deputy Director of theUnited States Patent and Trademark Office*